United States Patent
Beall et al.

(10) Patent No.: US 6,824,608 B2
(45) Date of Patent: Nov. 30, 2004

(54) SEED CRYSTAL FOR EPITAXIAL GROWTH OF SINGLE-CRYSTAL CALCIUM FLUORIDE

(75) Inventors: George H. Beall, Big Flats, NY (US); Charles W. Deneka, Corning, NY (US); Gitimoy Kar, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 89 days.

(21) Appl. No.: 10/244,897

(22) Filed: Sep. 16, 2002

(65) Prior Publication Data

US 2003/0019420 A1 Jan. 30, 2003

Related U.S. Application Data

(63) Continuation of application No. 09/818,160, filed on Mar. 27, 2001, now Pat. No. 6,451,111.

(51) Int. Cl.⁷ ............................................. C30B 15/20
(52) U.S. Cl. .............................. 117/13; 117/81; 117/83
(58) Field of Search ........................... 117/13, 81, 83; 252/63.3 R; 423/328.2

(56) References Cited

U.S. PATENT DOCUMENTS

| | | | |
|---|---|---|---|
| 2,149,076 A | 2/1939 | Stockbarger | 23/88 |
| 2,214,976 A | 9/1940 | Stockbarger | 23/273 |
| 4,038,201 A | 7/1977 | Hargreaves | 252/300 |
| 4,053,572 A | 10/1977 | Moss et al. | 423/490 |
| 5,215,631 A | 6/1993 | Westfall | 204/64 R |
| 6,201,634 B1 * | 3/2001 | Sakuma et al. | 359/322 |

FOREIGN PATENT DOCUMENTS

| | | | |
|---|---|---|---|
| WO | WO00/75405 | 12/2000 | C30B/11/00 |
| WO | WO00/75697 | 12/2000 | G02B/1/02 |

OTHER PUBLICATIONS

Chernevskaya, et al, "Optical Characteristics of Large Single Crystals of Fluorides" Optical Technology, vol. 40, No. 6, Jun. 1973.

* cited by examiner

Primary Examiner—Felisa Hiteshew
(74) Attorney, Agent, or Firm—Walter M. Douglas

(57) ABSTRACT

A nucleant seed for epitaxial growth of single-crystal $CaF_2$ includes $SrF_2$. In some embodiments, $YF_3$, $LaF_3$, or rare-earth fluoride is substituted into the $SrF_2$ structure.

11 Claims, 3 Drawing Sheets

SEED CRYSTAL FOR EPITAXIAL GROWTH OF SINGLE-CRYSTAL CALCIUM FLUORIDE

This application is a continuation of U.S. patent application Ser. No. 09/818,160, filed Mar. 27, 2001, now U.S. Pat. No. 6,451,111 and claims the priority of said application.

BACKGROUND OF THE INVENTION

1. Field of the Invention

The invention relates generally to processes for producing $CaF_2$ crystals. More specifically, the invention relates to a nucleant seed for epitaxial growth of single-crystal $CaF_2$.

2. Background Art

Single-crystal $CaF_2$ is commonly grown using the Bridgman-Stockbarger crystal growth process. For epitaxial growth of $CaF_2$, the process starts, as illustrated in FIG. 1, with a seed crystal 2 made of $CaF_2$ and having the desired crystallographic orientation. For deep-ultraviolet microlithography applications, for example, the desired crystallographic orientation is <111>, i.e., cubic (octahedral or cubic forms) crystal structure. The seed crystal 2 is placed at the base of a crucible 4. A starting material 6 comprising $CaF_2$ powder (or beads) is placed in the crucible 4, on top of the seed crystal 2. The crucible 4 is then placed in a vertical furnace 8 and heated to a temperature sufficient to melt the starting material 6. To prevent oxidation of the starting material 6 and the components of the furnace 8, the furnace 8 is typically maintained under vacuum and/or the process is carried out in an inert atmosphere.

After melting the starting material 6, the crucible 4 is moved downwardly at a predetermined rate (typically 0.3 to 5 mm/h), from a hot zone 10 into a cold zone 12. An insulating barrier 14 separates the hot zone 10 from the cold zone 12. FIG. 2 shows a typical temperature distribution along the vertical axis of the furnace (8 in FIG. 1). A single crystal of $CaF_2$ forms on the seed crystal (2 in FIG. 1) when the molten material reaches the zone 12 in which the furnace temperature is below the melting point of $CaF_2$. The $CaF_2$ crystal front propagates inside the crucible 4, within the material 6, as long as the crucible 4 is caused to move downwardly. The $CaF_2$ crystal conforms to the crystallographic orientation of the seed crystal 2 as it propagates inside the crucible 4.

To enhance the optical properties of the $CaF_2$ crystal, a scavenger is typically added to the starting material 6 to remove oxygen and hydroxyl ions. These impurities have been known to reduce transmission in the deep-ultraviolet region. The most common scavenger used is $PbF_2$. $PbF_2$ is solid and can be added directly to the starting material 6. Typically, a specific amount of $PbF_2$, typically 1 to 2% by weight, is mixed into the starting material 6. The mixture is then gradually heated to approximately 800° C. to 900° C., at which point $PbF_2$ reacts with the starting material 6 to form PbO. After the reaction is complete, the more volatile PbO is evaporated from the mixture by heating the mixture to the melting point of $CaF_2$ or higher. In an attempt to remove as much of the PbO as possible through volatization, the $CaF_2$ melt may become overheated and cause the seed crystal 2, which is also made of $CaF_2$, to completely melt and lose its crystallographic orientation.

SUMMARY OF THE INVENTION

In one aspect, the invention relates to a nucleant seed for epitaxial growth of single-crystal $CaF_2$ which comprises $SrF_2$. In some embodiments, a second fluoride is substituted in the $SrF_2$ structure, the second fluoride being selected from the group consisting of $YF_3$, $LaF_3$, rare-earth fluoride, and combinations thereof. In some embodiments, the rare-earth fluoride comprises one selected from the group consisting of $YF_3$, $LaF_3$, $CeF_3$, $NdF_3$, $PrF_3$, $DyF_3$, $SmF_3$, $EuF_3$, $TbF_3$, and $GdF_3$.

Other aspects and advantages of the invention will be apparent from the following description and the appended claims.

DETAILED DESCRIPTION

Embodiments of the invention provide a seed crystal for use in growing oriented, single-crystal $CaF_2$. The seed crystal is structurally similar to $CaF_2$ but has a higher melting point than $CaF_2$. In one embodiment of the invention, the seed crystal comprises $SrF_2$. There is crystallographic disregistry between $SrF_2$ and $CaF_2$, but this disregistry is well within the accepted values for effective nucleation of $CaF_2$ by $SrF_2$. In other embodiments of the invention, the seed crystal comprises a solid solution of $SrF_2$ and a fluoride such as $LaF_3$, $YF_3$, rare-earth fluorides, or combinations thereof. Examples of rare-earth fluorides suitable for use in the invention include, but are not limited to, $CeF_3$, $NdF_3$, $PrF_3$, $DyF_3$, $SmF_3$, $EuF_3$, $TbF_3$, and $GdF_3$. The effect of the fluoride substituted in the $SrF_2$ structure is to further increase the melting point of the seed crystal.

Figure 1:
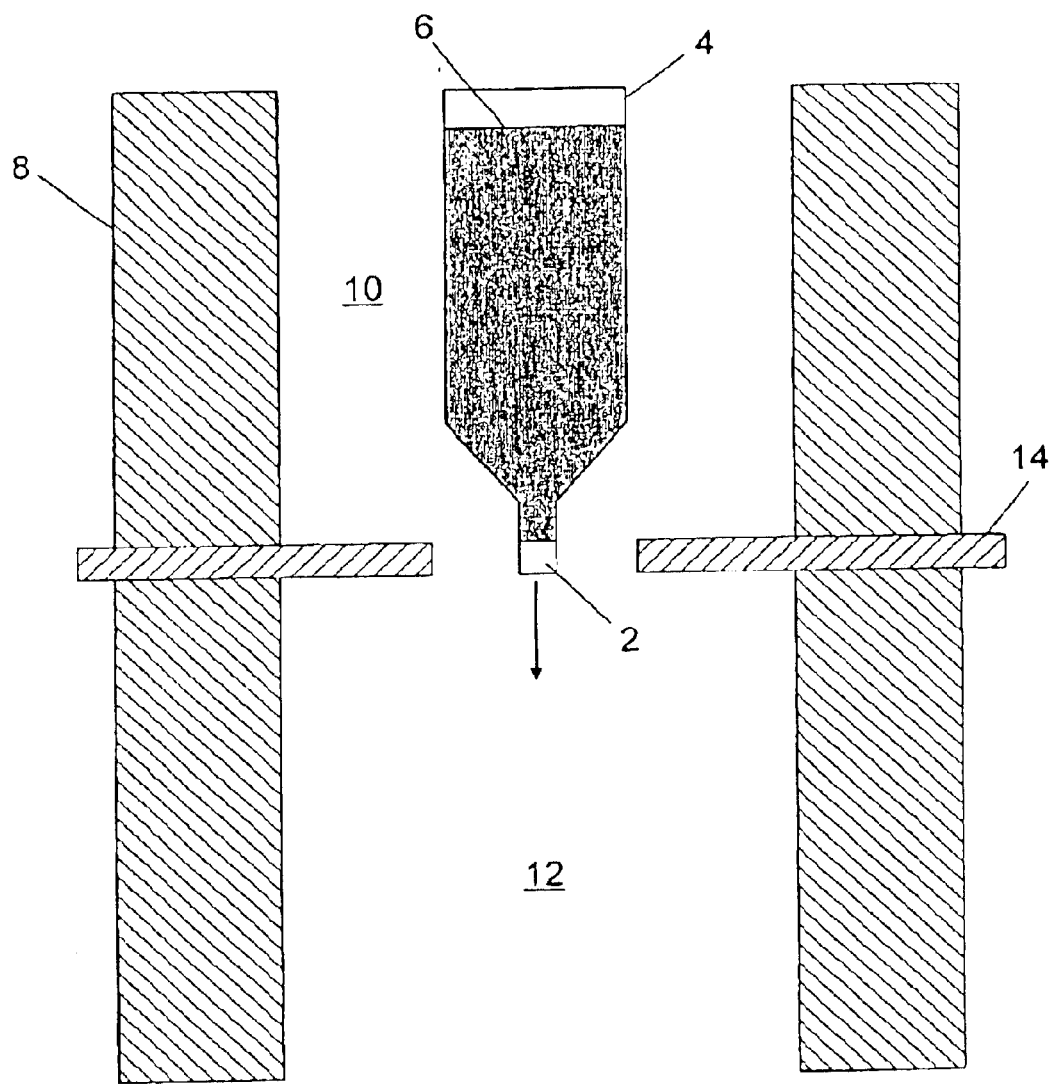
FIG. 1 illustrates a Bridgman-Stockbarger crystal growth process.
Figure 2:
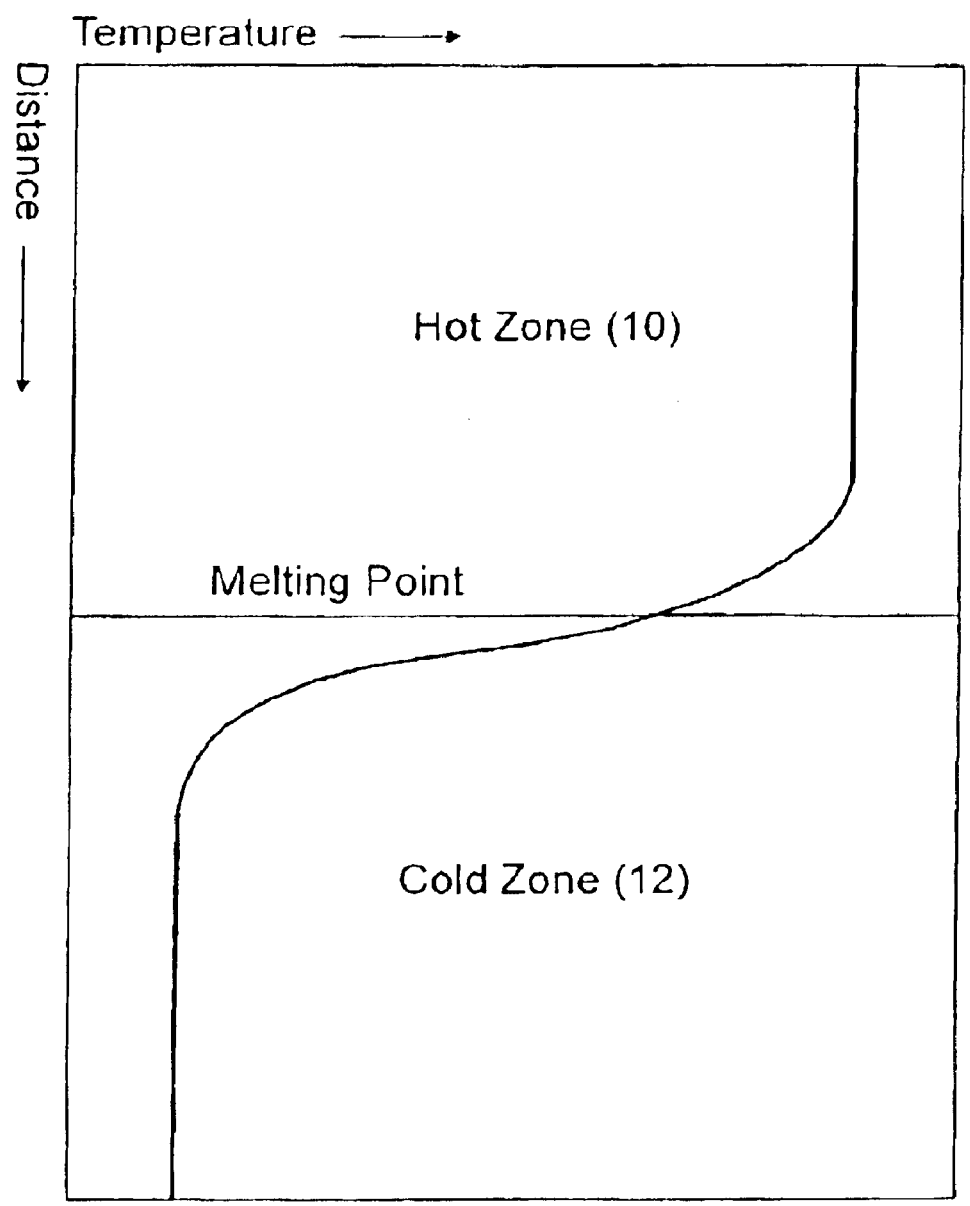
FIG. 2 shows a temperature distribution along a vertical axis of the furnace shown in FIG. 1.

$CaF_2$ melts around 1415° C. The only other known fluoride phase with the same structure as $CaF_2$ and which has a melting point higher than $CaF_2$ is the strontium analog $SrF_2$. The melting point of this phase of $SrF_2$ is near 1455° C., about 40° C. higher than $CaF_2$. When pure $SrF_2$ is used as a seed crystal for the growth of $CaF_2$ crystal, the starting material (6 in FIG. 1) can be heated to much higher temperatures than the melting point of $CaF_2$ without melting the $SrF_2$ seed crystal. Of course, given enough time, that time being dependent upon kinetic factors, an essentially infinite reservoir of $CaF_2$ liquid would eventually dissolve even a refractory seed like $SrF_2$ or $SrF_2$-$LaF_3$ solid solution, but the time of survival will be longer than with a metable $CaF_2$ seed.

When a scavenger such as $PbF_2$ is added to the starting material (6 in FIG. 1), maximum removal of the by-products of the scavenging process can be removed via volatization without melting the $SrF_2$ seed crystal. Even if the $SrF_2$ seed crystal succumbs to dissolution in overheated $CaF_2$ melt, the process will be much slower than for melting or dissolution of a $CaF_2$ seed. Thus, removal of the by-products of the scavenging process can be completed before the seed crystal completely melts and loses its crystallographic orientation.

The melting point of the $SrF_2$ seed crystal can be increased by adding a fluoride, e.g., $YF_3$, $LaF_3$, rare-earth fluoride, or combinations thereof, to $SrF_2$. The strontium analog $SrF_2$ phase forms considerable solid solution, often up to 50 mole %, with $YF_3$, $LaF_3$, and rare-earth fluorides such as $CeF_3$, $NdF_3$, $PrF_3$, $DyF_3$, $SmF_3$, $EuF_3$, $TbF_3$, and $GdF_3$. The solid solution is formed by mixing molten $SrF_2$ with the fluoride and then cooling the mixture. The solid solution can be made to have a desired crystallographic orientation by cooling the mixture at a certain temperature. The fluoride gets substituted in the $SrF_2$ structure. The effect of these substitutions is usually to further increase the melting point of the $SrF_2$-$CaF_2$ solid solution. The melting point can be increased by 50° C. to 100° C. with $LaF_3$ and rare-earth substitutions in the 10 to 30 mole % range. The following table shows the melting point achieved by various fluoride substitutions in $SrF_2$.

TABLE 1

Melting Point for Solid Solutions of $SrF_2$ and rare-earth fluorides

| Seed Crystal | Substitution in mole % | Melting Point (° C.0) |
| --- | --- | --- |
| Pure $SrF_2$ | | 1455 |
| $SrF_2$—$YF_3$ | 11 | 1460 |
| $SrF_2$—$LaF_3$ | 30 | 1550 |
| $SrF_2$—$CeF_3$ | 29 | 1550 |
| $SrF_2$—$NdF_3$ | 25 | 1535 |
| $SrF_2$—$PrF_3$ | 30 | 1540 |
| $SrF_2$—$DyF_3$ | 12 | 1490 |
| $SrF_2$—$SmF_3$ | 21 | 1525 |
| $SrF_2$—$EuF_3$ | 20 | 1510 |
| $SrF_2$—$TbF_3$ | 15 | 1500 |
| $SrF_2$—$GdF_3$ | 16 | 1520 |

Figure 3:
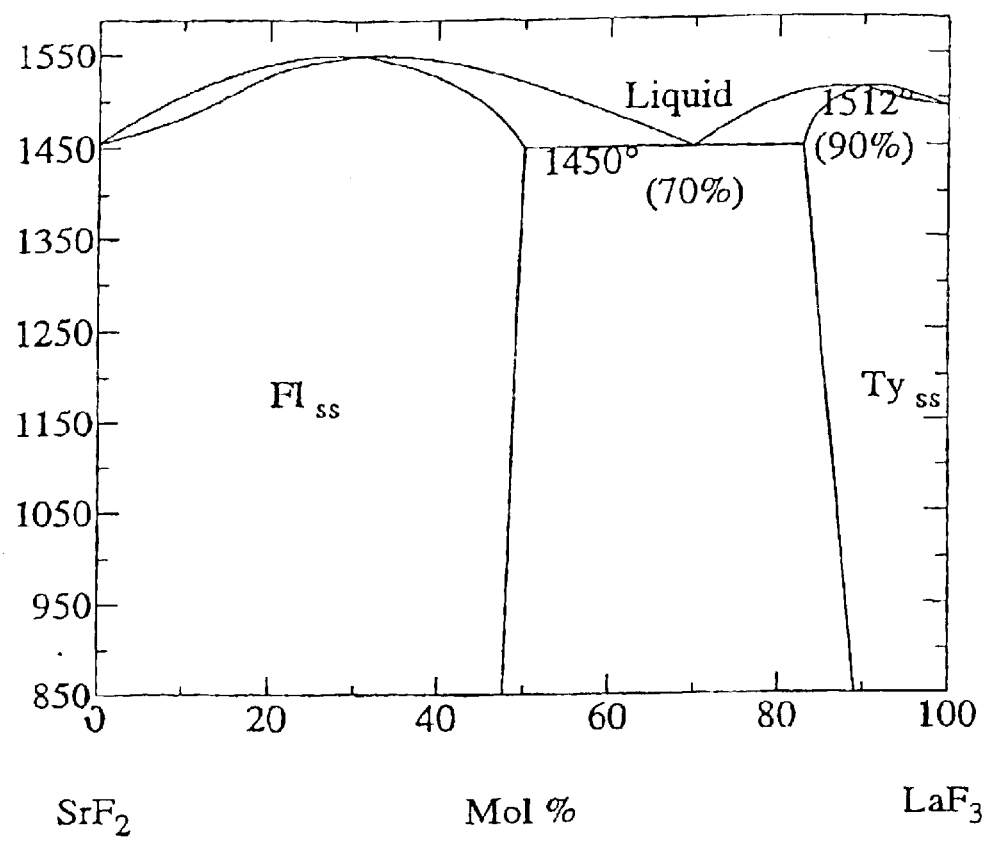
FIG. 3 shows a phase diagram for $SrF_2$ and $LaF_3$.

The solid solutions shown in Table 1 above are expected to be effective as nucleant seeds for the epitaxial growth of $CaF_2$. Some small-ion rare-earths like Ho, Er, Yb, and Lu either lowered or did not increase the melting point of the seed crystal. It should be noted that $LaF_3$, $YF_3$, or rare-earth fluorides themselves are not appropriate as seed crystals because they are structurally dissimilar to $CaF_2$. Furthermore, the structure of the solid solution will become dissimilar to $CaF_2$ if too much fluoride is mixed into $SrF_2$. The amount of fluoride to be mixed into $SrF_2$ can be deduced from appropriate phase diagrams. See, for example, L. P. Cook and H. F. McMurdie, Eds., "Phase Diagrams for Ceramists," vol. V11, FIGS. 7581-7987, American Ceramic Society, 1989. FIG. 3 shows a phase diagram for $SrF_2$ and $LaF_3$. The phase diagram shows that $SrF_2$ forms solid solution of up to approximately 47 mole % with $LaF_3$. The highest melting point of the $SrF_2$-$LaF_3$ solid solution occurs when $LaF_3$ substitution is about 30 mole %.

The invention provides general advantages. By using structurally similar but more refractory nucleant seed for growing the single-crystal $CaF_2$, maximum removal of the by-product of the scavenging process can be removed without completely melting the seed crystal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A nucleant seed for epitaxial growth of a single-crystal $CaF_2$ comprising $SrF_2$.

2. A nucleant seed for epitaxial growth of a single crystal $CaF_2$ comprising a fluoride substituted in the $SrF_2$ structure, the fluoride selected from the group consisting of $YF_3$, $LaF_3$, rare-earth fluoride, and combinations thereof.

3. The nucleant seed of claim 2, wherein the rare-earth fluoride comprises one selected from the group consisting of $CeF_3$, $NdF_3$, $PrF_3$, $DyF_3$, $SmF_3$, $EuF_3$, $TbF_3$, and $GdF_3$.

4. The nucleant seed of claim 3, wherein the fluoride substitutions in the $SrF_2$ structure is in a range from 10 to 30 mole %.

5. A process for producing a single-crystal $CaF_2$ from a melt, comprising:

contacting the melt with a seed comprising $SrF_2$; and moving the melt at a rate in the range of 0.3 to 5 mm/h through a thermally-graded zone so that the single-crystal $CaF_2$ is grown on the seed.

6. The process of claim 5, wherein the seed further comprises a fluoride substituted in the $SrF_2$ structure, the fluoride selected from the group consisting of $YF_3$, $LaF_3$, rare-earth fluoride, and combinations thereof.

7. The process of claim 6, wherein the rare-earth fluoride comprises one selected from the group consisting of $YF_3$, $LaF_3$, $CaF_3$, $NdF_3$, $PrF_3$, $DyF_3$, $SmF_3$, $EuF_3$, $TbF_3$, and $GdF_3$.

8. The process of claim 7, wherein the rare-earth substitutions the $SrF_2$ is in a range from 10 to 30 mole %.

9. A process for producing a single-crystal $CaF_1$ from a melt, comprising:

contacting the melt with a seed having a composition $SrF_2$-X, where X is selected from the group consisting of $YF_3$, $LaF_3$, rare-earth fluoride, and combinations thereof; and moving the melt at a rate in the range of 0.3 to 5 mm/h through a thermally-graded zone so that the $CaF_2$ crystal is grown on the seed.

10. The process of claim 9, wherein the rare-earth fluoride comprises one selected from the group consisting of $YF_3$, $LaF_3$, $CeF_3$, $NdF_3$, $PrF_3$, $DyF_3$, $SmF_3$, $EuF_3$, $TbF_3$, and $GdF_3$.

11. The process of claim 10, wherein the rare-earth substitution in the $SrF_2$ is in a range from 10 to 30 mole %.

* * * * *

UNITED STATES PATENT AND TRADEMARK OFFICE
CERTIFICATE OF CORRECTION

PATENT NO. : 6,824,608 B2 Page 1 of 1
DATED : November 30, 2004
INVENTOR(S) : George H. Beall et al.

It is certified that error appears in the above-identified patent and that said Letters Patent is hereby corrected as shown below:

Column 4,
Line 31, "$CaF_3$" should read -- $CeF_3$ --

Signed and Sealed this

Twenty-sixth Day of April, 2005

JON W. DUDAS
*Director of the United States Patent and Trademark Office*